United States Patent
Zhang et al.

(10) Patent No.: US 9,368,637 B2
(45) Date of Patent: Jun. 14, 2016

(54) THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Li Zhang, Beijing (CN); Chunsheng Jiang, Beijing (CN); Dongfang Wang, Beijing (CN); Haijing Chen, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/348,763

(22) PCT Filed: Jul. 15, 2013

(86) PCT No.: PCT/CN2013/079346
§ 371 (c)(1),
(2) Date: Mar. 31, 2014

(87) PCT Pub. No.: WO2014/166176
PCT Pub. Date: Oct. 16, 2014

(65) Prior Publication Data
US 2015/0214373 A1     Jul. 30, 2015

(30) Foreign Application Priority Data

Apr. 7, 2013 (CN) .......................... 2013 1 0117218

(51) Int. Cl.
  *H01L 29/786*     (2006.01)
  *H01L 27/12*      (2006.01)
  *H01L 29/66*      (2006.01)

(52) U.S. Cl.
  CPC ........ *H01L 29/7869* (2013.01); *H01L 27/1225* (2013.01); *H01L 27/1248* (2013.01); *H01L 27/1262* (2013.01); *H01L 29/66969* (2013.01)

(58) Field of Classification Search
  CPC ................ H01L 27/1214; H01L 27/12; H01L 29/66757
  See application file for complete search history.

(56) References Cited

U.S. PATENT DOCUMENTS

| | | | | |
|---|---|---|---|---|
| 6,646,287 | B1 * | 11/2003 | Ono et al. | ......................... 257/66 |
| 2003/0025127 | A1 * | 2/2003 | Yanai | ....................... H01L 27/12 257/158 |

(Continued)

FOREIGN PATENT DOCUMENTS

| | | |
|---|---|---|
| CN | 102208452 A | 10/2011 |
| CN | 102569185 A | 7/2012 |

(Continued)

OTHER PUBLICATIONS buffer. (n. d.) Random House Kernerman Webster's College Dictionary. (2010). Retrieved Jul. 11, 2015 from http://www.thefreedictionary.com/buffer.*

(Continued)

Primary Examiner — Jerome Jackson, Jr.
Assistant Examiner — Charles R Peters
(74) Attorney, Agent, or Firm — Ladas & Parry LLP

(57) ABSTRACT

A thin film transistor (TFT) and manufacturing method thereof, an array substrate and a display device are provided. The thin film transistor comprises a substrate; an active layer formed on the substrate; a first conductive contact layer and a second conductive contact layer formed on the active layer; an etch-stop layer formed over the first contact layer and the second contact layer; and a source connected with the first contact layer, a drain connected with the second contact layer and a gate arranged between the source and the drain formed over the etch-stop layer. The TFT has a simple structure and better performance.

16 Claims, 7 Drawing Sheets

(56) References Cited

U.S. PATENT DOCUMENTS

| | | | |
|---|---|---|---|
| 2011/0084262 A1 | 4/2011 | Kondratyuk et al. | |
| 2011/0227878 A1* | 9/2011 | Makita | 345/175 |
| 2011/0240998 A1 | 10/2011 | Morosawa et al. | |
| 2011/0272675 A1* | 11/2011 | Chung | H01L 51/5221 257/40 |
| 2012/0162585 A1 | 6/2012 | Liu et al. | |

FOREIGN PATENT DOCUMENTS

| | | |
|---|---|---|
| CN | 102646715 A | 8/2012 |
| CN | 20317987 U | 9/2013 |
| TW | 201121055 A | 6/2011 |

OTHER PUBLICATIONS

International Search Report for International Application No. PCT/CN2013/079346 issued Jan. 16, 2014, 12pgs.

First Office Action (Chinese Language) from State Intellectual Property Office of the People's Republic of China in Chinese Patent Application No. 201310117218.0, issued Feb. 28, 2015; 9 pages.

English translation of First Office Action from State Intellectual Property Office of the People's Republic of China in Chinese Patent Application No. 201310117218.0, issued Feb. 28, 2015; 8 pages.

English Abstract of CN102569185A (listed above); 1 page.

English Abstract of CN203179897U (listed above); 1 page.

Zhang Yu-Wen, et al: "Reduction of metal oxide in nonequilibrium hydrogen plasma", The Chinese Journal of Nonferrous Metals, vol. 14, No. 2, Feb. 2004; 5 pages.

Second Chinese Office Action dated Jun. 15, 2015; Appln. No. 201310117218.0.

International Preliminary Report on Patentability issued Oct. 13, 2015; PCT/CN2013/079346.

Third Chinese Office Action dated Sep. 29, 2015; Appln. No. 201310117218.0.

\* cited by examiner

THIN FILM TRANSISTOR AND MANUFACTURING METHOD THEREOF, ARRAY SUBSTRATE AND DISPLAY DEVICE

CROSS REFERENCE TO RELATED APPLICATIONS

This application is based on International Application No. PCT/CN2013/079346 filed on Jul. 15, 2013, which claims priority to Chinese National Application No. 201310117218.0 filed on Apr. 7, 2013. The entire contents of each and every foregoing application are incorporated herein by reference.

TECHNICAL FIELD

Embodiments of the present invention relate to a thin film transistor and a manufacturing method thereof, an array substrate and a display device.

BACKGROUND

In the field of display technology, oxide thin film transistors (TFTs) become a hot topic due to their higher carrier mobility, higher thermal and chemical stability with respect to amorphous-silicon thin film transistors (a-Si TFTs), wherein the carrier mobility of the oxide TFTs is ten times as great as that of the a-Si TFTs. The display device driven by the oxide TFT can meet the requirements of large size and high resolution display devices, especially meet the requirements of the next generation of active matrix organic light emitting devices (AMOLEDs), thus it dominates the field of flat panel display.

Currently, since the requirements for fabricating an oxide TFT are high, simplifying the device structure and process is a goal that people have been pursuing all the time under the premise of ensuring fabricating a high performance oxide TFT. The conventional oxide TFT usually uses a top gate type. FIG. 1 shows a conventional pixel electrode drive structure using a top gate type oxide TFT comprising: a substrate 101, an active layer 102 formed on the substrate 101, a gate insulating layer 103 formed on the active layer 102, a gate 104 formed on the gate insulating layer 103, an etch-stop layer 105 formed over the gate 104, a source and drain layer 106 (comprising a source and a drain) formed over the etch-stop layer 105, a passive layer 107 formed over the source and drain layer 106 and a pixel electrode 108 formed over the passive layer 107 and connected with the drain of the source and drain layer 106.

The top gate TFT as shown in FIG. 1 is fabricated by using the following 6-Mask process. A pattern process generally at least comprises a mask process, an exposure process, a development process, a lithography process and an etching process, wherein each exposure process uses a mask corresponding to pattern to be formed.

First, a pattern of an active layer 102 is formed through a first pattern process.

Second, patterns of a gate insulating layer 103 and the gate 104 are formed through a second pattern process. In the procedure, the gate 104 is firstly formed through a wet etching process, and then the gate insulating layer 103 is formed through a dry etching process.

Third, a pattern of an etch-stop layer 105 is formed through a third pattern process.

Fourth, a pattern of a source and drain layer 106 is formed through a fourth pattern process.

Fifth, a pattern of a passive layer 107 is formed through a fifth pattern process, wherein a contact hole is formed on the passive layer 107 configured to connect the drain electrode and the subsequently formed pixel electrode 108.

Six, a pattern of the pixel electrode 108 is formed through a six pattern process.

Accordingly, the conventional TFT has complex structure, and since 6-mask process is used to fabricate the high performance oxide, the process is complicated. Furthermore, since each additional pattern process may contaminate the function film layers of the oxide TFT, this method reduces the performance of the oxide TFT.

SUMMARY

The embodiments of the present invention provide a thin film transistor and manufacturing method thereof, an array substrate and a display device for providing a TFT with simple structure and better performance.

An aspect of the present invention provides a thin film transistor comprising: a substrate, an active layer formed on the substrate, a first conductive contact layer and a second conductive contact layer formed on the active layer, an etch-stop layer formed over the first contact layer and the second contact layer, and a source connected with the first contact layer, a drain connected with the second contact layer and a gate located between the source and the drain formed over the etch-stop layer.

According to an embodiment of the present invention, the first contact layer and the second contact layer are arranged in mirror symmetry.

According to an embodiment of the present invention, the gate and the first contact layer have a projection area in the vertical direction, which is equal to that of the gate and the second contact layer in the vertical direction.

According to an embodiment of the present invention, a distance between the first contact layer and the second contact layer is 2-3 μm.

According to an embodiment of the present invention, the thin film transistor further comprises an isolation layer provided between the active layer and the substrate configured to isolate light.

According to an embodiment of the present invention, the thin film transistor further comprises a pixel electrode formed above the protection layer, the pixel electrode is electronically connected with the drain under the protection layer through a via hole in the protection layer.

Another aspect of the present invention provides an array substrate comprising the forgoing thin film transistors.

Another aspect of the present invention provides a display device comprising the forgoing array substrates.

Yet another aspect of the present invention provides a method of fabricating the thin film transistor, and the method comprises:

forming a pattern including an active layer on the substrate;

forming a pattern of a first contact layer and a second contact layer on the active layer by implanting ions into the selected region of the active layer;

forming a pattern including an etch-stop layer over the substrate formed with the first contact layer and the second contact layer;

forming a source pattern connecting with the first contact layer, a drain pattern connecting with the second contact layer and a gate pattern located between the source and the drain over the etch-stop layer;

forming a protection layer pattern over the substrate formed with the gate, the source and the drain, wherein the protection layer covers the entire substrate.

According to an embodiment of the present invention, the step of forming a pattern including an active layer on the substrate and the step of forming a pattern of a first contact layer and a second contact layer on the active layer by implanting ions into the selected region of the active layer comprise:

forming a metal oxide semiconductor layer on the substrate;

applying a layer of photoresist on the metal oxide semiconductor layer;

performing a mask, an exposure and a development process to the photoresist by using a half-tone or gray-tone mask;

forming the active layer pattern by using a wet etching process;

performing an ashing process to the photoresist remained on the active layer to expose portions of the active layer corresponding to the first contact layer and the second contact layer to be formed;

forming the first contact layer and the second contact layer patterns by implanting ions into the exposed portions of the active layer; and removing the photoresist over the active layer.

According to an embodiment of the present invention, the method further comprises forming an isolation layer on the substrate for isolating light before forming the active layer.

According to an embodiment of the present invention, the step of forming the isolation layer comprises forming a layer of alumina, a layer of amorphous-silicon, or a mixing layer of metal and silicon oxide on the substrate.

According to an embodiment of the present invention, the step of forming the first contact layer and the second contact layer patterns by implanting ions into the exposed portions of the active layer comprises: forming the first contact layer and the second contact layer patterns by performing hydrogen plasma treatment to the exposed portions of the active layer.

According to an embodiment of the present invention, the method further comprises forming a pixel electrode connecting with the drain over the protection layer after forming the protection layer.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

The embodiments of the present invention provide a thin film transistor (TFT) and manufacturing method thereof, an array substrate and a display device. The provided TFT has a simple structure and better performance.

The source, the drain and the gate of the TFT can be formed in the same layer according to an embodiment of the present invention, thereby the structure of the TFT is simplified. Additionally, since the procedure of fabricating the TFT uses 5-Mask process, that is, 5 masks are used in the fabricating process of the TFT, it is simplified. Additionally, since the first contact layer connecting with the source and the second contact layer connecting with the drain are formed on the active layer, the process can avoid the generating of a non-channel high resistance region, and parasitic capacitance between the gate and the source or between the gate and the drain, thereby allowing the TFT having well electrical properties.

The TFTs according to embodiments of the present invention will be described in detail hereinafter in conjunction with accompanying drawings.

Figure 1:
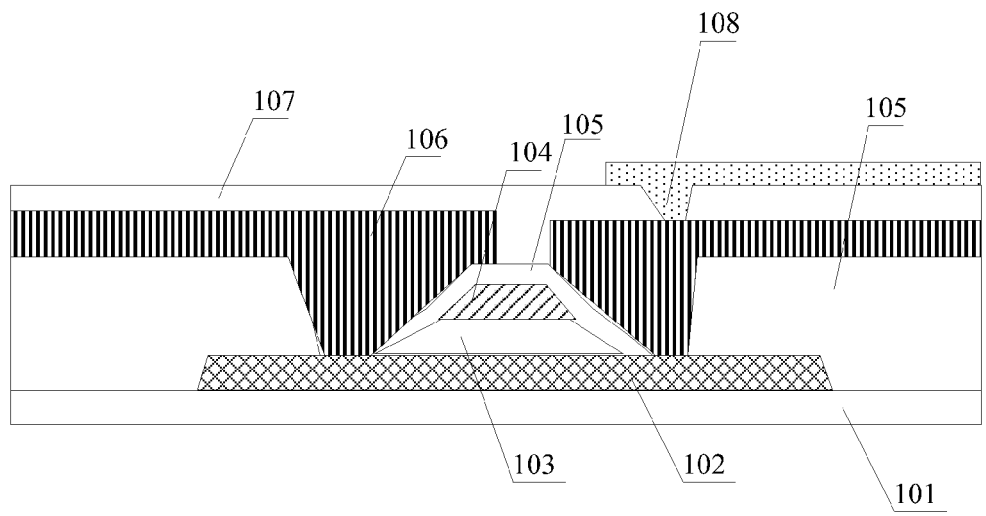
FIG. 1 is a schematic structural view of a top gate type TFT in the prior art.
Figure 2:
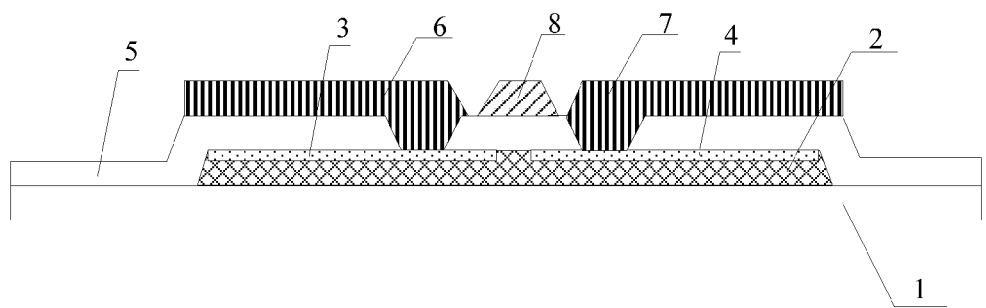
FIG. 2 is a schematic structural view of a TFT according to an embodiment of the present invention.

FIG. 2 shows a TFT according to an embodiment of the present invention, which comprises a substrate 1, an active layer 2 formed on the substrate 1, a first conductive contact layer 3 and a second conductive contact layer 4 formed on the active layer 2, an etch-stop layer 5 formed over the first contact layer 3 and the second contact layer 4 and covering the entire substrate 1, and a source 6, a drain 7 and a gate 8 formed over the etch-stop layer 5. The source 6 is connected with the first contact layer 3 through a via hole in the etch-stop layer 5. The drain 7 is connected with the second contact layer 4 through a via hole in the etch-stop layer 5. The active layer 2 is a metal oxide semiconductor layer. The substrate 1 can be a glass substrate, a quartz substrate, a plastic substrate or the like.

According to the TFT provided by the embodiment(s) of the present invention, the source 6, the drain 7 and the gate 8 are provided in the same layer, thereby the structure of the TFT is simplified.

As shown in FIG. 2, the first contact layer 3 is located between the source 6 and the active layer 2, and contacts with both of the source 6 and the active layer 2; the second contact layer 4 is located between the drain 7 and the active layer 2, and contacts with both of the drain 7 and the active layer 2. The first contact layer 3 and the second contact layer 4 can act as an ohmic contact layer, which can decrease the contact resistance between the source 6 and the active layer 2, and improve the contact between the active layer 2 and the source 6. Similarly, the second contact layer 4 can decrease the contact resistance between the drain 7 and the active layer 2, and improve the contact between the active layer 2 and the drain 7, thus improve the performance of the TFT.

Additionally, with the first contact layer 3 and the second contact layer 4 located under the gate 8, it can avoid generating of a non-channel high resistance region and a parasitic capacitance between the gate and the source or between the gate and the drain, which can further improve the performance of the TFT.

For example, referring to FIG. 2, the first contact layer 3 can be located under the source 6, the second contact layer 4 can be located under the drain 7. The first contact layer 3 and the second contact layer 4 can be arranged in mirror symmetry with respect to each other. And the first contact layer 3 and the second contact layer 4 can be located directly over the active layer 2.

For example, the overlapping area of the gate 8 and the first contact layer 3 can be equal to that of the gate 8 and the second contact layer 4, and the overlapping area is not zero.

For example, the projection area of the gate 8 and the first contact layer 3 in the vertical direction can be equal to that of the gate 8 and the second contact layer 4 in the vertical direction, effectively avoiding the generating of a non-channel high resistance region.

The embodiment(s) of the present invention can flexibly control the channel width of the active layer by controlling the distance between the first contact layer and the second contact layer, that is, the channel width is the distance between the first contact layer and the second contact layer. For example, the width of channel can be decreased as far as possible to improve the performance of the TFT.

For example, the minimum distance between the first contact layer and the second contact layer can be controlled in the limit parameter of the mask or the exposure machine according to requirements. The limit parameter is associated with the light source, mask or the like used in the corresponding exposure process. For example, the minimum distance between the first contact layer and the second contact layer can be controlled in a range of 2-3 µm.

Figure 3:
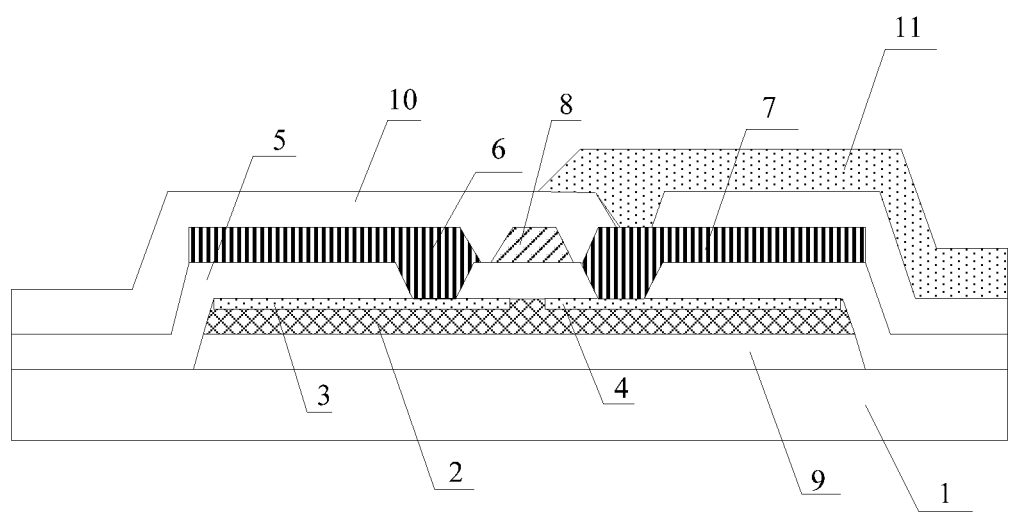
FIG. 3 is a schematic structural view of the TFT in FIG. 2 having a protection layer and a pixel electrode.

According to an embodiment of the present invention, referring to FIG. 3, the TFT as shown in FIG. 2 further comprises an isolation layer 9 located between the substrate 1 and the active layer 2, such as a film layer for isolating light. The isolation layer 9 can effectively block the light transmitted from the back of the substrate 1, and especially effectively block the ultraviolet light which the active layer 2 is sensitive to, thereby further improve the performance of the TFT.

According to an embodiment of the present invention, the isolation layer 9 can be an aluminium oxide ($Al_2O_3$) layer, an amorphous-silicon (a-Si) layer, or a film layer formed by depositing a combination of metal and silicon oxide and the like. The isolation layer 9 usually has a strong adhesion to the substrate 1. Thus, the isolation layer 9 can also function as a buffer between the substrate 1 and the active layer 2, that is, it can serve as a buffer layer, to increase the ability of the active layer 2 attaching to the substrate 1.

According to an embodiment of the present invention, referring to FIG. 3, the TFT further comprises a protection layer 10 located above the gate 8, the source 6 and the drain 7, which covers the entire substrate 1. If the TFT is used to drive a pixel unit, the TFT used in the drive structure (array substrate) further comprises a pixel electrode 11 located over the protection layer 10 and connected with the drain 7, as shown in FIG. 3.

The protection layer 10 has a via hole exposing the drain 7 so that the drain 7 is electrically connected with the pixel electrode 11 over the protection layer.

According to an embodiment of the present invention, the active layer can be a metal oxide semiconductor layer, such as indium gallium zinc oxide (IGZO), hafnium indium zinc oxide (HIZO), indium zinc oxide (IZO), amorphous indium zinc oxide (a-InZnO), amorphous fluoride doped zinc oxide (ZnO:F), tin doped indium oxide ($In_2O_3$:Sn), amorphous molybdenum doped indium oxide ($In_2O_3$:Mo), chrome tin oxide ($Cd_2SnO_4$), amorphous aluminum doped zinc oxide (ZnO:Al), amorphous niobium doped titanium oxide ($TiO_2$:Nb), chrome tin oxide (Cd—Sn—O) or the other metal oxide layers, and the like.

The first contact layer and the second contact layer can be a metal layer or an alloy layer.

The source, the drain and the gate can be formed of molybdenum (Mo) or aluminum neodymium alloy (AlNd), or the like.

The etch-stop layer can be a silicon oxide ($SiO_x$) layer, a silicon nitride ($SiN_x$) layer or a silicon oxynitride layer. And the etch-stop layer can be a single layer, double layer or multilayer.

The protection layer (PVX layer) can be a silicon oxide layer or a silicon nitride layer.

The pixel electrode can be a transparent metal oxide film layer, such as indium tin oxide (ITO) or indium zinc oxide (IZO) film layer.

The embodiment(s) of the present invention also provide(s) an array substrate comprising the described thin film transistor, wherein the thin film transistor can, for example, act as a switch element of each of the pixel units.

The array substrate(s) according to the embodiment(s) of the present invention can be an array substrate in a liquid crystal display panel or an array substrate in an organic light-emitting display panel.

Figure 4:
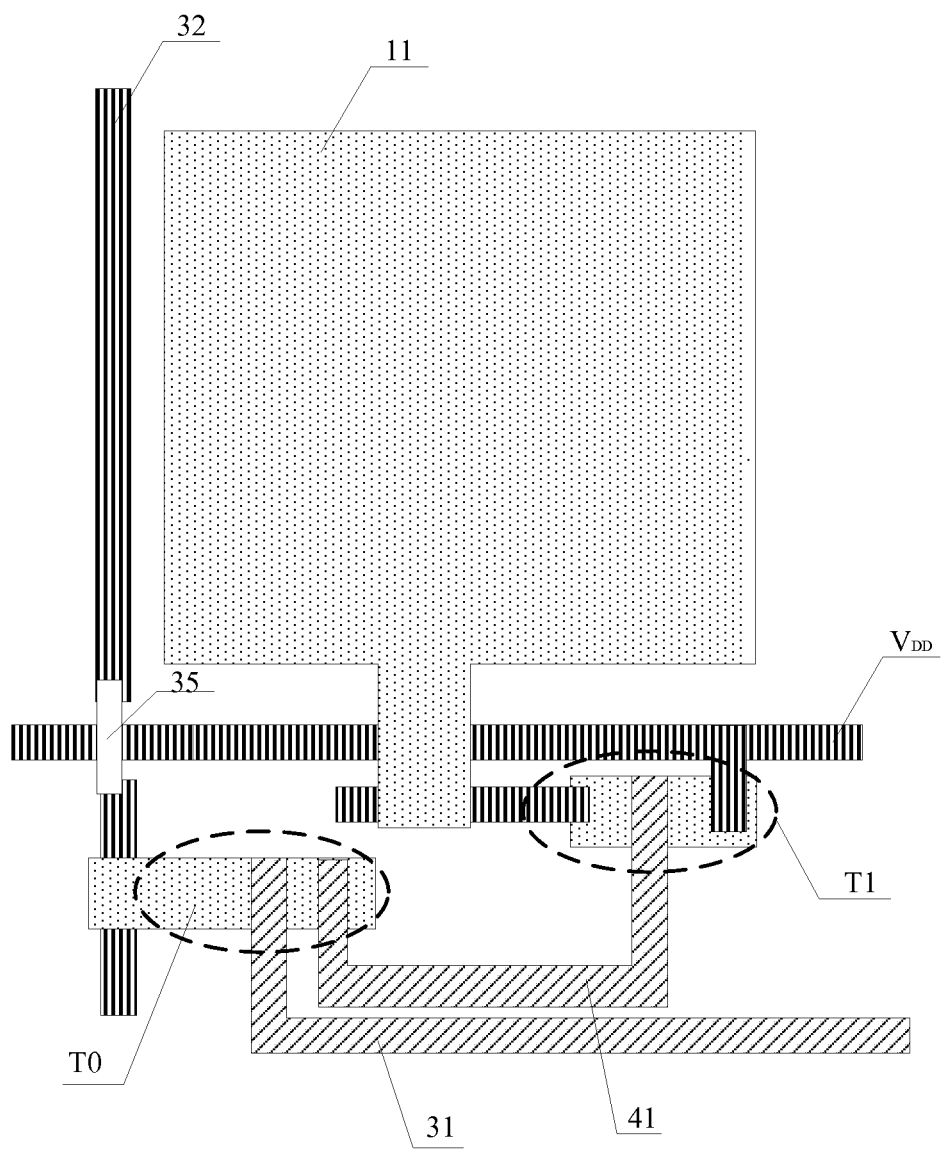
FIG. 4 is a schematic view of an array substrate according to an embodiment of the present invention.

For example, referring to FIG. 4, the array substrate is an array substrate in organic light-emitting display panel comprising a plurality of sub pixel structures, each of sub pixel structures comprises two TFTs of a switch TFT (T0) and a drive TFT (T1).

The drain of the switch TFT (T0) is connected with the gate of the drive TFT (T1) via a connecting line 41; the source of the switch TFT (T0) is connected with a data line 32 and the gate thereof is connected with a gate line 31.

The source of the drive TFT (T1) is connected with a $V_{DD}$ line, the $V_{DD}$ line provides a supply voltage to the drive TFT (T1) during normal operation; the drain of the drive TFT (T1) is connected with the pixel electrode 11.

The data line 32 is intersected with the gate line 31. The $V_{DD}$ line is arranged parallel to the gate line 31.

The disconnected data lines 32 are electrically connected via a connecting line 35.

The method(s) of fabricating the TFT according to the embodiment(s) of the present invention will be described in detail hereinafter. For example, referring to FIG. 5, the method of fabricating the TFT can comprise steps.

S11: forming a pattern including an active layer on the substrate by a coating process and a pattern process;

forming a first contact layer and a second contact layer patterns on the active layer by implanting ions into the selected regions of the active layer. This step relates to a first mask process for fabricating the TFT;

S12: forming a pattern including an etch-stop layer on the substrate formed with the first contact layer and the second contact layer by a coating process and a pattern process. This step relates to a second mask process for fabricating the TFT;

S13: forming a source pattern connected with the first contact layer, a drain pattern connected with the second contact layer and a gate pattern located between the source and the drain on the etch-stop layer by a coating process and a pattern process. This step relates to a third mask process for fabricating the TFT;

S14: forming a protection layer pattern over the substrate formed with the gate, the source and the drain by a coating process and a pattern process, wherein the protection layer covers the whole substrate. This step relates to a fourth mask process for fabricating the TFT.

According to an embodiment of the present invention, the forming a pattern including an active layer on the substrate by a coating process and a pattern process and the forming a first contact layer and a second contact layer patterns on the active layer by implanting ions into the selected regions of the active layer comprises:

forming a metal oxide semiconductor layer on the substrate by the coating process;

coating a layer of photoresist on the metal oxide semiconductor layer;

performing mask, exposure and development process to the photoresist by using a half-tone or gray-tone mask;

forming the active layer pattern by using a wet etching process;

performing an ashing process to the photoresist remained on the active layer to expose the portions of the active layer corresponding to the first contact layer and the second contact layer to be formed;

forming the first contact layer and the second contact layer patterns by implanting ions into the exposed portions of the active layer;

removing the photoresist over the active layer.

According to an embodiment of the present invention, the method further comprises forming an isolation layer on the substrate by the coating process before forming the active layer.

According to an embodiment of the present invention, the step of forming the isolation layer comprises forming a layer of aluminium oxide, a layer of a-Si or a mixing layer of metal and silicon oxide on the substrate by a coating process.

According to an embodiment of the present invention, the step of forming the first contact layer and the second contact layer patterns by implanting ions into the exposed portions of the active layer comprises: forming the first contact layer and the second contact layer patterns by performing hydrogen plasma treatment to the exposed portions of the active layer.

According to an embodiment of the present invention, the method further comprises forming a pixel electrode connected with the drain over the protection layer by a coating process and a pattern process after forming the protection layer. This step relates to a fifth mask process for fabricating the TFT.

Herein, the pattern or the pattern process comprises a mask process, an exposure process, a development process, a lithography process and an etching process, and the like, for fabricating the patterns. The used photoresist can be a positive photoresist or a negative photoresist. The coating process can be a process of chemical vapor deposition, sputtering, or the like.

The method of fabricating the TFT according to the embodiment(s) of the present invention includes 5 masks process, in such a way, compared with the conventional process, it can save technique procedures, reduce the possibility of the TFT being contaminated and improve the performance of the TFT.

Figure 5:
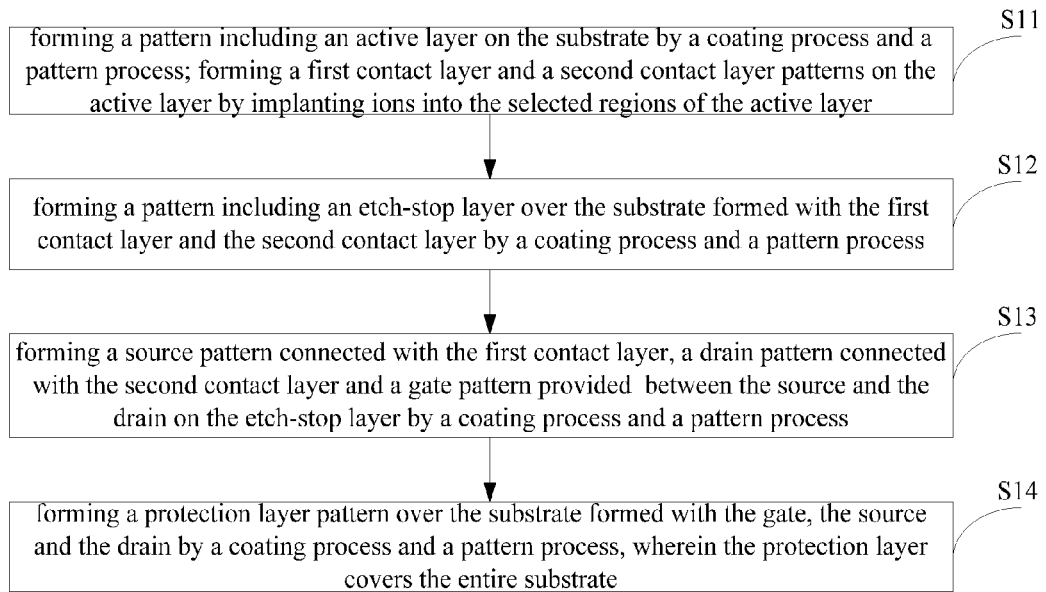
FIG. 5 is a flow chart of a method of fabricating the TFT according to an embodiment of the present invention.

The procedure of the method of fabricating the TFT as shown in FIG. 5 will be described in detail hereinafter. For example, the method of fabricating the array substrate according to the embodiment(s) of the present invention comprises steps:

S21: firstly, forming a film layer covering the whole substrate on a glass substrate or a quartz substrate by a sputtering process, a thermal evaporation process or the like; the film layer can be an aluminium oxide ($Al_2O_3$) layer, an amorphous-silicon (a-Si) layer, a film layer (metal plus $SiO_2$) formed by depositing a combination of metal and silicon oxide, or the like.

S22: plating a metal oxide film layer (for example IGZO), on basis of S21.

S23: applying or coating a layer of photoresist covering the entire substrate on basis of S22; and then performing the following steps.

Firstly, the mask, exposure and development process are performed to the photoresist by using a half-tone or gray-tone mask.

Figure 6:
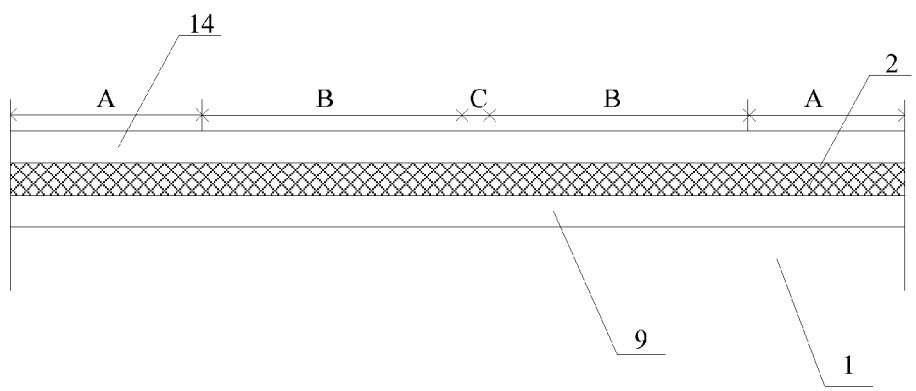
FIG. 6 is a schematic structural view of a half-tone or gray-tone mask according to an embodiment of the present invention.
Figure 7:
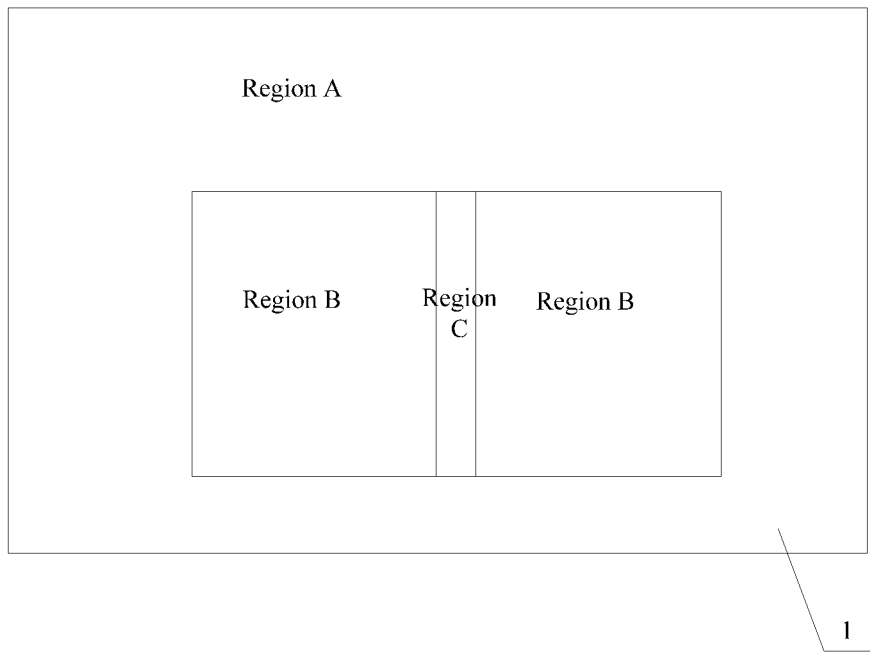
FIG. 7 is a top view of the TFT as shown in FIG. 6.

For example, as shown in FIG. 6 (sectional view) and FIG. 7 (top view), during the exposure, a half-tone or gray-tone mask is used, and after the development, a completely exposed region A (i.e., a region where the photoresist is removed completely), a partially exposed region B (i.e., a region where the photoresist is remained partially), and an unexposed region C (i.e., a region where the photoresist is remained completely) are formed on the photoresist layer 14. The unexposed region C of the photoresist layer 14 corresponds to an insulating region between the first contact layer and the second contact layer to be formed, wherein the photoresist is substantially remained completely. The completely exposed region A of the photoresist layer 14 corresponds to a substrate region outside of the active layer pattern, wherein the photoresist is substantially removed completely. The partially exposed regions B of the photoresist layer 14 correspond to regions on which the first contact layer and the second contact layer are to be formed, wherein the photoresist is remained partially so that the thickness of the photoresist in regions B is smaller than that of the photoresist in the completely remained region C.

Figure 8:
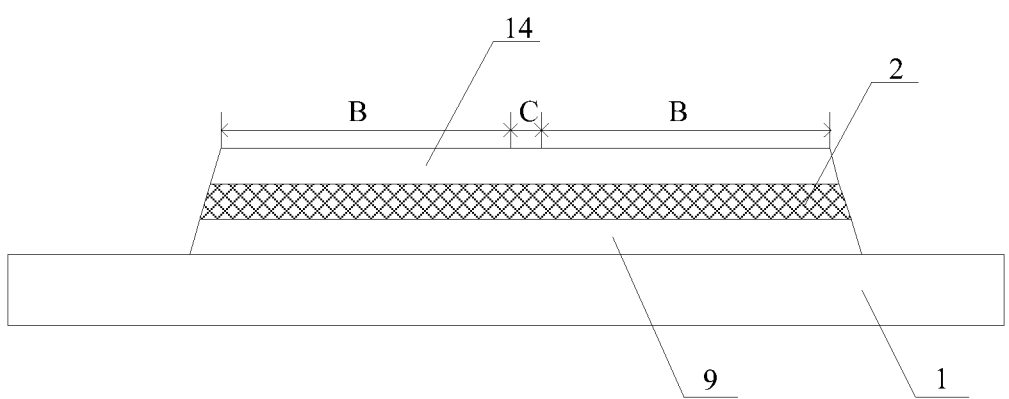
FIG. 8 is a schematic structural view of the TFT formed with an active layer and a photoresist on the active layer according to an embodiment of the present invention.

Next, one wet etching process is performed so that the photoresist at a region corresponding to the completely exposed region A of the photoresist layer 14 is removed and the film layer under the photoresist and above the substrate 1 is etched off, as shown in FIG. 8.

Figure 9:
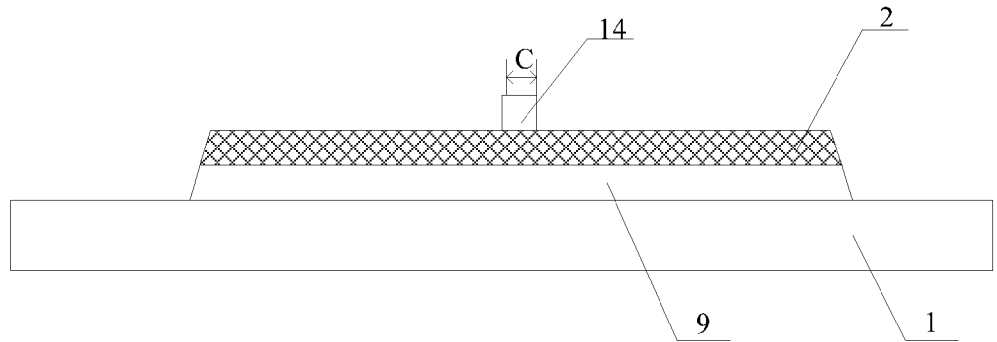
FIG. 9 is a schematic structural view of the TFT in FIG. 8 exposing the region of the active layer corresponding to the first contact layer and the second contact layer.

Then, an ashing process is performed to the photoresist layer remained on the partially exposed region B of the photoresist layer 14 to remove the photoresist in the partially exposed region B, thereby expose the corresponding portions 2 of the active layer; meanwhile the photoresist layer in the unexposed region C of the photoresist layer is remained to cover the corresponding portions of the active layer 2, as shown in FIG. 9.

Figure 10:
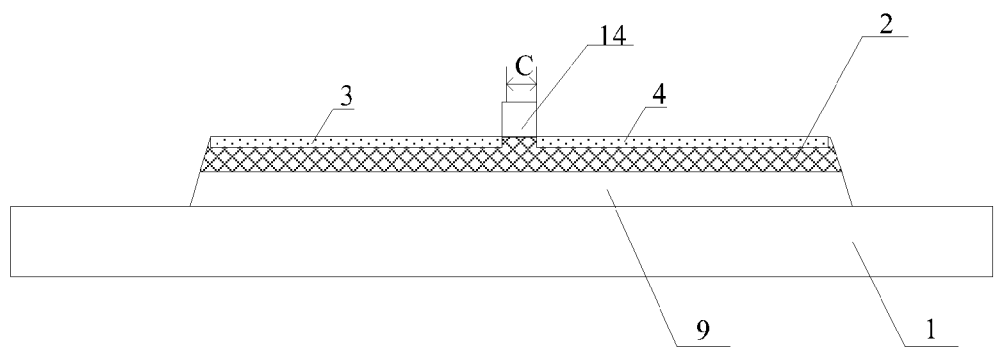
FIG. 10 is a schematic structural view of the TFT in FIG. 9 formed with the first contact layer and the second contact layer.

Next, the ion implantation is performed to the exposed portions of the active layer 2, the surface layer of the portions of the active layer implanted with ions forms the first contact layer 3 and the second contact layer 4 respectively located outside of the unexposed region C, and the active layer in the unexposed region C of the photoresist layer is not implanted with ions due to the remained photoresist thereon, as shown in FIG. 10. The implanted ion can be for example H ion, that is, the plasma hydrogen. The first contact layer 3 and the second contact layer 4 can also be formed by performing doping to the exposed active layer 2.

The first contact layer 3 and the second contact layer 4 are metal or alloy layers formed by implanting H ions into metal oxide semiconductor layers (active layers). They have a small contact resistance with the metal oxide semiconductor layers and have a well adhesion with the metal oxide semiconductor layers. And, since the first contact layer 3 and the second contact layer 4 are metal or alloy layers, the source and the drain also are metal or alloy layers. In such a way, the first contact layer 3 and the second contact layer 4 can avoid generating a parasitic capacitance between the source the gate, and also can avoid the generating of a parasitic capacitance between the drain and the gate, thereby can improve the performance of the TFT.

Last, the photoresist layer 14 in the unexposed region C is removed.

Figure 11:
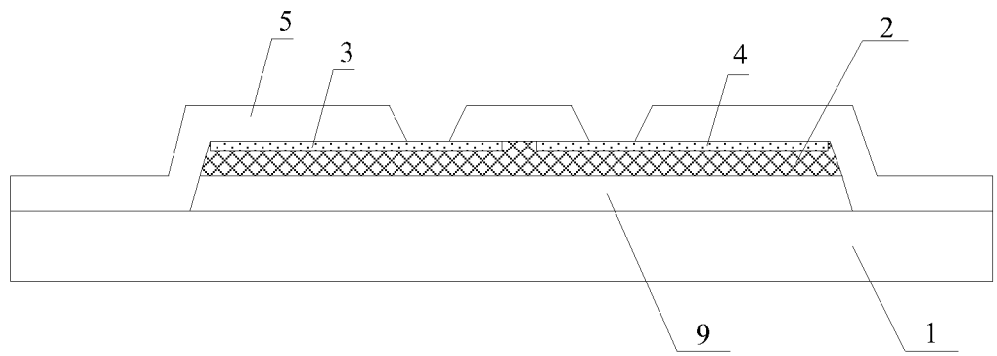
FIG. 11 is a schematic structural view of the TFT in FIG. 10 formed with an etch-stop layer.
Figure 12:
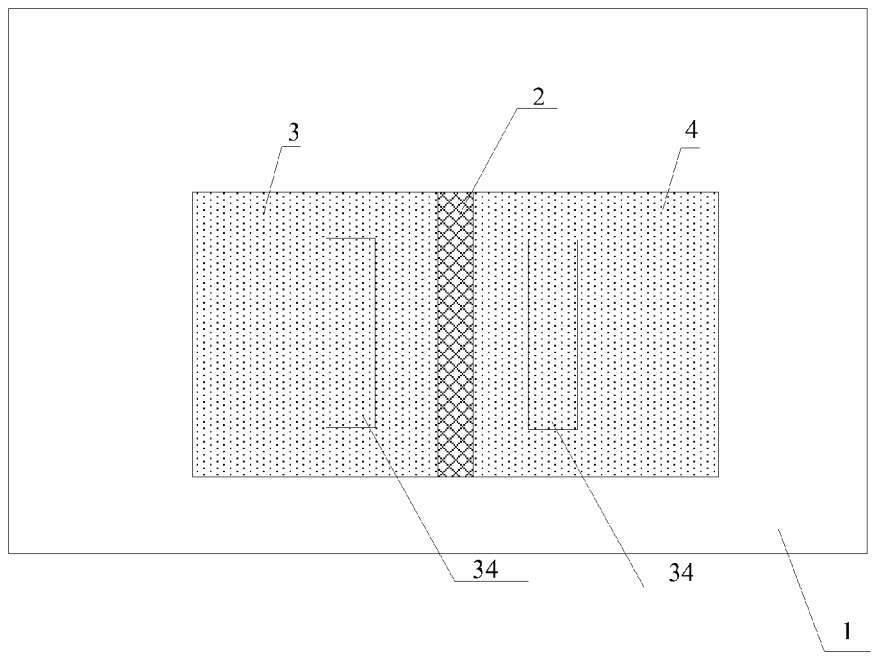
FIG. 12 is a top schematic view of the TFT as shown in FIG. 11.

S24: forming an insulating layer by a coating process on the basis of the TFT formed in the step S23, for example, forming a silicon nitride layer or a silicon oxide layer; and forming an etch-stop layer by one mask, exposure and development and dry etching process. The sectional view of FIG. 11 and the top view of FIG. 12 show the TFT formed with the etch-stop layer 5. Two via holes 34 (that is, contact holes) are formed on the etch-stop layer 5 by a dry etching process. The via holes 34 are located at the positions on which the source and the drain are to be formed and allow the first contact layer 3 and the second contact layer 4 to be exposed.

Figure 13:
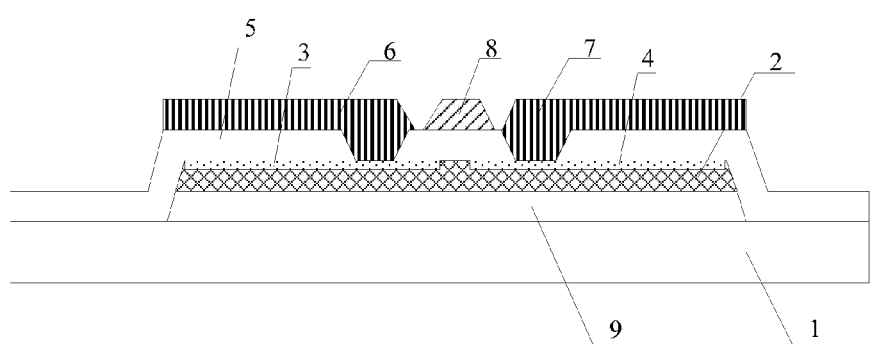
FIG. 13 is a schematic structural view of the TFT as shown in FIG. 11 formed with a source, a drain and a gate.

S25: forming a conductive film layer by a coating process on the basis of the TFT formed in the step S24, such as a molybdenum (Mo) or aluminum neodymium alloy (AlNd) layer or the like; forming the source 6, the drain 7 and the gate 8 as shown in FIG. 13 by one pattern process, for example, wet etching process. For example, the overlapping area of the gate 8 and the first contact layer 3 can be equal to that of the gate 8 and the second contact layer 4.

S26: forming an insulating layer by a plating process on the basis of the TFT formed in the step S25; and forming a protection layer 10 by performing masking, exposing and developing and dry etching or the like to the insulation layer. The protection layer 10 has a via hole located above the drain 7 so as to expose the drain 7, as shown in FIG. 3.

S27: forming a conductive film layer, such as ITO, by a plating process on the basis of the TFT formed in the step S26; and forming a pattern including a pixel electrode 11 by a mask, an exposure and a development and a dry etching process or the like, and the formed TFT as shown in FIG. 3.

It should be appreciated that a gate line connected with the gate is fabricated while the gate is fabricated; a data line connected with the source (or the drain) is fabricated while the source (or the drain) is fabricated. One of the gate line and the data line can be formed in segments; as shown in FIG. 4, the data line 32 is formed in segments. A connecting line connecting the segmented gate lines or the segmented data lines is fabricated according to the requirements when the pixel electrode is fabricated, such as the connecting line 35 as shown in FIG. 4, for example.

It should be appreciated that the above described steps of fabricating the TFT are applicable to the liquid crystal display field, and also are applicable to the organic light-emitting display field.

Embodiments of the present invention further provide a display device comprising the above described array substrate(s). The display device can be a liquid crystal display panel, a liquid crystal display, a liquid crystal television, an OLED panel, an OLED display, an OLED television or an electronic paper and the like.

An example of the display device is a liquid crystal display device, wherein the array substrate and an opposed substrate are opposed to each other to form a liquid crystal cell, the liquid crystal cell is filled with a liquid crystal material. The opposed substrate is a color film substrate, for example. The pixel electrode of each pixel unit in the array substrate is configured to apply an electric field to the liquid crystal material to control the degree of the rotation of the liquid crystal material, thereby to perform display operation. In some examples, the liquid crystal display further includes a backlight source configured to provide backlights to the array substrate.

Another example of the display device is an organic light-emitting display device (OLED), wherein, the thin film transistor of each pixel unit in the array substrate is connected with an anode or a cathode of the OLED configured to drive the organic light-emitting material to perform display operation.

As described above, the embodiments of the present invention provide a TFT with simplified structure by fabricating the source, the drain and the gate on the same layer. And since the procedure of fabricating the TFT uses 5-Mask process, the process of fabricating the TFT is simplified. Additionally, since the first contact layer connected with the source and the second contact layer connected with the drain are formed on the active layer, it can avoid the generating of a non-channel high resistance region and a parasitic capacitance between the gate and the source or between the gate and the drain, allowing the TFT to have well electrical properties.

It is apparent that those skilled in the art can make various variations and modifications to the present invention without departure from the spirit and the scope of the present invention, and the present invention is intended to include such variations and modifications and equivalents thereof fall in the scope of the claims of the present invention.

The invention claimed is:

1. A thin film transistor comprising:
   a substrate;
   an active layer formed on the substrate;
   a first conductive contact layer and a second conductive contact layer formed on the active layer;
   an etch-stop layer formed over the first contact layer and the second contact layer; and
   a source connected with the first contact layer, a drain connected with the second contact layer and a gate located between the source and the drain formed over the etch-stop layer, the source, the drain and the gate are in a same layer,
   wherein the thin film transistor further comprises a protection layer formed over the source, the drain and the gate, and a pixel electrode formed over the protection layer, and
   wherein the pixel electrode is electronically connected with the drain under the protection layer by a via hole on the protection layer.

2. The thin film transistor according to claim 1, wherein the first contact layer and the second contact layer are arranged in mirror symmetry.

3. The thin film transistor according to claim 2, wherein the gate and the first contact layer have an overlapping area in the vertical direction, which is equal to that of the gate and the second contact layer in the vertical direction.

4. The thin film transistor according to claim 3, wherein the overlapping area is not zero.

5. The thin film transistor according to claim 1, wherein the gate and the first contact layer have a projection area in the vertical direction, which is equal to that of the gate and the second contact layer in the vertical direction.

6. The thin film transistor according to claim 1, wherein a distance between the first contact layer and the second contact layer is 2-3 μm.

7. The thin film transistor according to claim 1, further comprises an isolation layer provided between the active layer and the substrate.

8. The thin film transistor according to claim 7, wherein the isolation layer is a layer configured to isolate light.

9. The thin film transistor according to claim 7, wherein the isolation layer is a layer of aluminum oxide.

10. An array substrate, comprising the thin film transistor according to claim 1.

11. A method of fabricating a thin film transistor, comprising:
    forming a pattern including an active layer on a substrate;
    forming a first contact layer and a second contact layer patterns on the active layer by implanting ions into the selected regions of the active layer;
    forming a pattern including an etch-stop layer over the substrate formed with the first contact layer and the second contact layer;
    forming a source pattern connected with the first contact layer, a drain pattern connected with the second contact layer and a gate pattern provided between the source and the drain on the etch-stop layer, such that the source, the drain and the gate are in a same layer; and
    forming a protection layer pattern on the substrate formed with the gate, the source and the drain, wherein the protection layer covers the entire substrate,
    wherein the step of forming a pattern including an active layer on a substrate; and the step of forming a first contact layer and a second contact layer patterns on the active layer by implanting ions into the selected ions of the active layer comprise steps:
    forming a metal oxide semiconductor layer on the substrate;
    coating a layer of photoresist on the metal oxide semiconductor layer;
    performing a mask, an exposure and a development process to the photoresist by using a half-tone or gray-tone mask;
    forming the active layer pattern by using a wet etching process;
    performing an ashing process to the photoresist remained on the active layer to expose portions of the active layer corresponding to the first contact layer and the second contact layer to be formed;
    forming the first contact layer and the second contact layer patterns by implanting ions into the exposed portions of the active layer; and
    removing the photoresist of the active layer.

12. The method according to claim 11, wherein the step of forming a first contact layer and a second contact layer patterns on the active layer by implanting ions into the selected regions of the active layer comprises: forming the first contact layer and the second contact layer patterns by performing hydrogen plasma treatment to the exposed portions of the active layer.

13. The method according to claim 11, further comprises forming an isolation layer on the substrate before forming the active layer.

14. The method according to claim 13, wherein the isolation layer on the substrate is a light isolating layer.

15. The method according to claim 13, wherein the step of forming the isolation layer comprises: forming a layer of aluminium oxide on the substrate.

16. A method of fabricating a thin film transistor, comprising:
    forming a pattern including an active layer on a substrate;
    forming a first contact layer and a second contact layer patterns on the active layer by implanting ions into the selected regions of the active layer;
    forming a pattern including an etch-stop layer over the substrate formed with the first contact layer and the second contact layer;
    forming a source pattern connected with the first contact layer, a drain pattern connected with the second contact layer and a gate pattern provided between the source and the drain on the etch-stop layer, such that the source, the drain and the gate are in a same layer; and
    forming a protection layer pattern on the substrate formed with the gate, the source and the drain, wherein the protection layer covers the entire substrate,
    the method further comprises forming a pixel electrode connected with the drain on the protection layer after forming the protection layer.

* * * * *